US008174537B2

(12) United States Patent
Chiang et al.

(10) Patent No.: US 8,174,537 B2
(45) Date of Patent: May 8, 2012

(54) SYSTEM AND METHOD FOR ADAPTIVE COLOR SPACE CONVERSION

(75) Inventors: Tsung Han Chiang, Kaohsiung (TW); Yuan-Chih Peng, Taipei (TW)

(73) Assignee: Sunplus Technology Co., Ltd., Hsinchu (TW)

( * ) Notice: Subject to any disclaimer, the term of this patent is extended or adjusted under 35 U.S.C. 154(b) by 561 days.

(21) Appl. No.: 12/382,839

(22) Filed: Mar. 25, 2009

(65) Prior Publication Data

US 2009/0251487 A1 Oct. 8, 2009

(30) Foreign Application Priority Data

Apr. 3, 2008 (TW) ............................... 97112358 A

(51) Int. Cl.

| | |
|---|---|
| ***G09G 5/02*** | (2006.01) |
| ***G09G 5/00*** | (2006.01) |
| ***G06K 9/40*** | (2006.01) |
| ***G06K 9/32*** | (2006.01) |
| ***H04N 1/46*** | (2006.01) |
| ***H04N 5/00*** | (2006.01) |
| ***G03F 3/08*** | (2006.01) |
| *H04N 5/44* | (2006.01) |
| *H04N 5/14* | (2006.01) |
| *H04N 5/202* | (2006.01) |
| *G06K 9/36* | (2006.01) |
| *G06K 9/00* | (2006.01) |

(52) U.S. Cl. ........ 345/604; 345/581; 345/591; 345/600; 345/606; 348/254; 348/560; 348/612; 348/671; 358/519; 358/523; 358/525; 382/167; 382/254; 382/274; 382/300

(58) Field of Classification Search .......... 345/426–428, 345/581, 589, 590–591, 600–604, 606, 620, 345/643–644; 348/253–254, 552, 560, 577, 348/612, 671, 678; 358/515–519, 523–525; 382/162–167, 254, 274, 276, 300
See application file for complete search history.

(56) References Cited

U.S. PATENT DOCUMENTS

| | | | | |
|---|---|---|---|---|
| 5,737,032 A * | 4/1998 | Stenzel et al. | ................ | 348/649 |
| 7,271,812 B2 | 9/2007 | Van Dyke et al. | | |
| 2002/0135683 A1 * | 9/2002 | Tamama et al. | ............... | 348/222 |
| 2002/0191845 A1 * | 12/2002 | Talley et al. | .................. | 382/166 |
| 2005/0100242 A1 * | 5/2005 | Trifonov et al. | ............. | 382/274 |

* cited by examiner

*Primary Examiner* — Wesner Sajous
(74) *Attorney, Agent, or Firm* — Bacon & Thomas, PLLC

(57) ABSTRACT

A method and system for adaptive color space conversion includes a color space converter, a brightness adaptive controller and a soft clipper. The color space converter receives a first color space format signal and converts the first color space format signal into a second color space format signal. The brightness adaptive controller is connected to the color space converter in order to produce a gain and an offset based on a brightness value. The soft clipper is connected to the color space converter and the brightness adaptive controller in order to clip the second color space format signal based on the gain and the offset to thereby produce a corrected second color space format signal.

20 Claims, 4 Drawing Sheets

SYSTEM AND METHOD FOR ADAPTIVE COLOR SPACE CONVERSION

BACKGROUND OF THE INVENTION

1. Field of the Invention

The present invention relates to the technical field of color processing and, more particularly, to a system and method for adaptive color space conversion.

2. Description of Related Art

The color image devices (such as a computer display) mostly use the three primary color signals, i.e., R, G, B, for color representation in the market. Since a typical color image device is designed in accordance with the color domain range rendered on the CRT screen. Thus, for the same color representation on the peripheral information products, a Standard RGB (sRGB) is defined as a standard color space for the information products based on the computer multimedia applications.

The Standard RGB (sRGB) specification is submitted by the HP Company and the Microsoft Corporation. The sRGB specification defines standard color conditions and code exchange modes. Since the color reproduction on the CRT screen is mostly considered for the color range of a typical image playback content, the sRGB specification is typically used as a basis.

However, owing to the rapid advance of technologies, the sRGB specification cannot meet the color representation for a high definition TV (HDTV). The image playback contents of the displays with color representation capability and requirement higher than the sRGB specification are thus limited to the sRGB range. In this case, the high-level displays cannot completely show the color playback features.

To overcome this, ICE 61966-2-4 defines a new standard for color space, which is referred to as xvYCC and can support the color information of wide color domain.

The xvYCC uses the ITU-R BT. 709 color domain to standardize a wider color domain for assuring the compatibility with the sRGB under the HDTV condition. The sRGB specification renders colors in a range of 0 to 1, and the xvYCC specification in a range of −1 to +1, which is over the color range defined by the sRGB specification. However, since the xvYCC is compatible with the sRGB, current image output products including a TV can receive the xvYCC image content and correctly display the colors of film under the sRGB specification.

The difference of the YCbCr representation between the xvYCC and the sRGB specifications is the defined gamut. FIG. 1 is a schematic graph of xvYCC and sRGB specifications. As shown in FIG. 1, the diamond indicates a gamut converted from BT. 709 RGB into YCbCr, i.e., the YCbCr gamut of the sRGB, and the YCbCr gamut of the xvYCC is extended to the periphery of the sRGB specification, for example, the two rectangles, thereby extending the gamut of color space. U.S. Pat. No. 7,271,812 granted to Van Dyke, et al. for a “Method and apparatus for color space conversion” has disclosed a method for color space conversion to convert between color space formats.

However, when YCbCr of the xvYCC specification is converted into BT. 709 RGB, the resulting RGB may exceed the gamut. A typical solution in the prior art limits the values over the gamut to the maximum and minimum, which is referred to as a hard clip. FIG. 2 is a schematic graph of a typical hard clip operation. Take 8-bit for example, a value over 255 is limited to 255, and a value smaller than zero is limited to zero. Namely, all the RGB input values exceeding a threshold (255) are limited to the maximum, i.e., the threshold. In this case, when the RGB values of pixels of an image exceed the threshold, the output values mostly are the threshold as the maximum (255) by a hard clip operation. Then, the details on image content. Thus, the output image content has a poorer representation in the details.

By contrast, a typical soft clip uses an additional oblique line to define the relationship between RGB input and output values when the RGB input values exceed a threshold. FIG. 3 is a schematic graph of a typical soft clip operation. As shown in FIG. 3, in the soft clip operation, when the RGB input values are smaller than a first threshold ‘a’, the relationship between the RGB input and output values is as same as that in the hard clip operation. When the RGB input values are greater than the first threshold ‘a’ and smaller than a second threshold ‘b’, an oblique line with a small slope is used to define the relationship between the RGB input and output values to thereby reduce the lost details of the image content occurred in the hard clip operation.

However, for a gray image, the maximum of a gray level cannot be displayed because the image is clipped. Accordingly, the brightness is reduced, which causes the eyes of a viewer uncomfortable.

Therefore, it is desirable to provide an improved system and method for adaptive color space conversion to mitigate and/or obviate the aforementioned problems.

SUMMARY OF THE INVENTION

The object of the present invention is to provide a method and system for adaptive color space conversion, which can overcome the problems in the typical soft clip operation that the maximum of a gray level cannot be displayed and the eyes of a viewer feel uncomfortable.

According to a feature of the invention, a system for adaptive color space conversion is provided, which includes a color space converter, a brightness adaptive controller and a soft clipper. The color space converter receives a first color space format signal and converts the first color space format signal into a second color space format signal. The brightness adaptive controller is connected to the color space converter in order to produce a gain and an offset based on a brightness value. The soft clipper is connected to the color space converter and the brightness adaptive controller in order to clip the second color space format signal based on the gain and the offset to thereby produce a corrected second color space format signal.

According to another feature of the invention, a method for adaptive color space conversion is provided, which includes: a color space conversion step, which receives a first color space format signal and converts the first color space format signal into a second color space format signal; a brightness adaptive control step, which produces a gain and an offset based on a brightness value; and a soft clip step, which clips the second color space format signal based on the gain and the offset to thereby produce a corrected second color space format signal.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
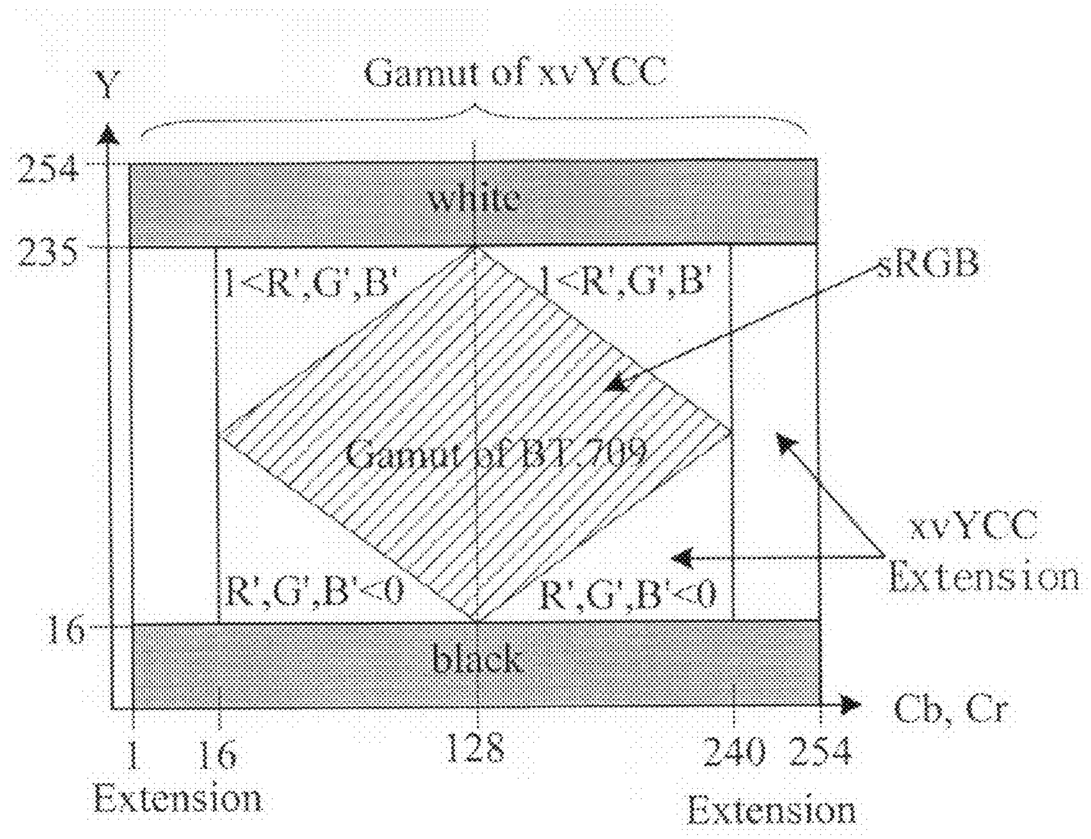
FIG. 1 (Prior Art)
FIG. 1 is a schematic graph of a typical YCbCr representation of xvYCC and sRGB specifications.
Figure 2:
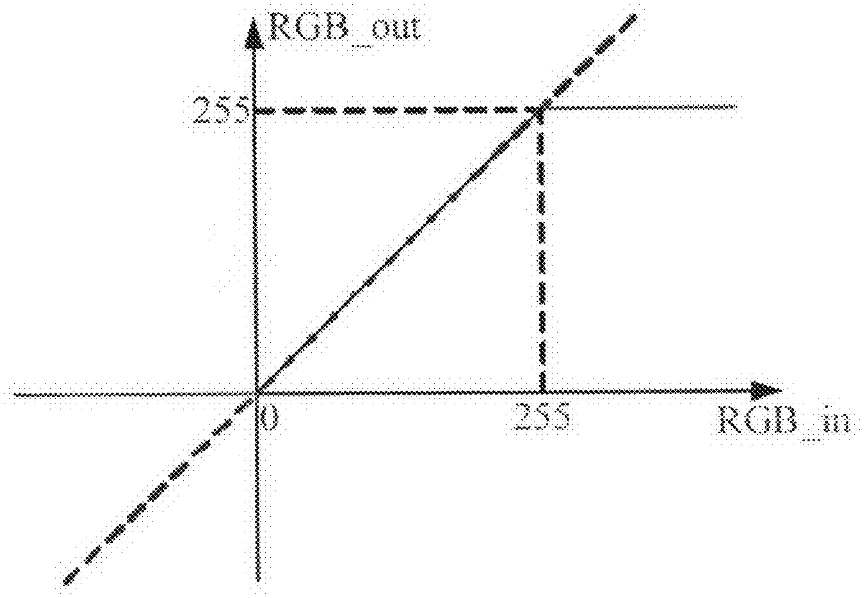
FIG. 2 (Prior Art)
FIG. 2 is a schematic graph of a typical hard clip operation.
Figure 3:
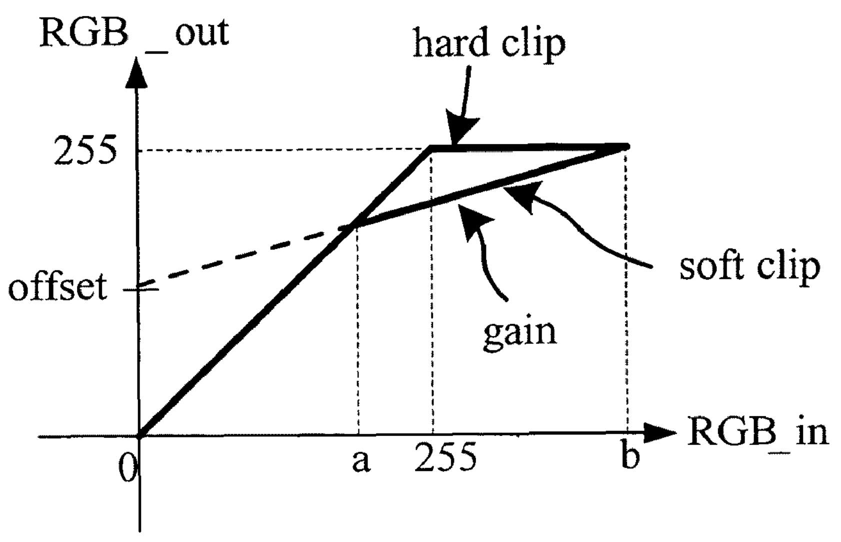
FIG. 3 (Prior Art)
FIG. 3 is a schematic graph of a typical soft clip operation.
Figure 4:
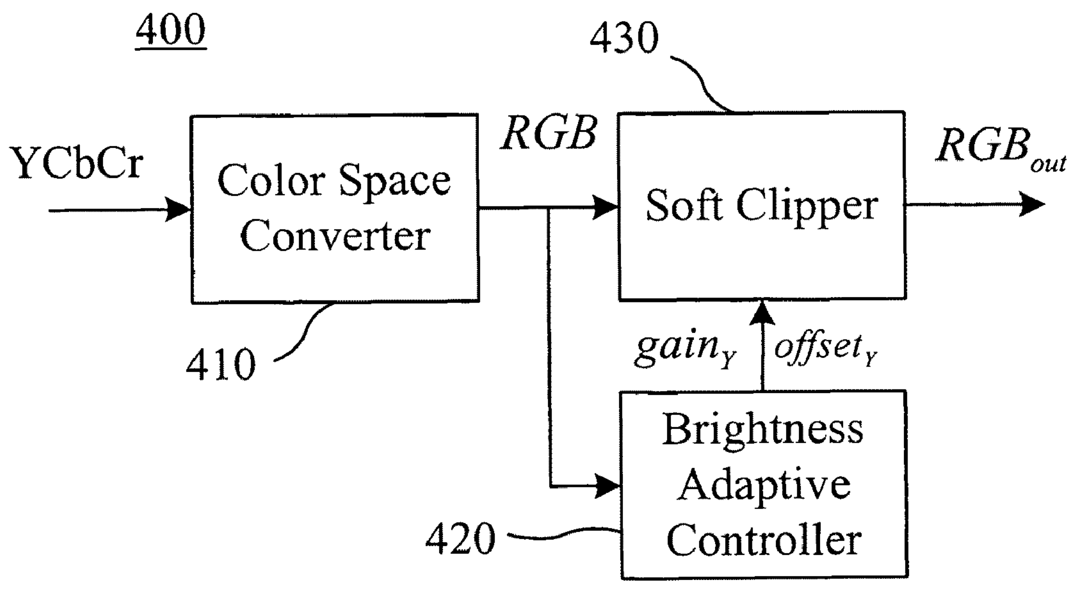
FIG. 4 is a block diagram of a system for adaptive color space conversion according to the invention.

FIG. 4 is a block diagram of a system 400 for adaptive color space conversion according to the invention. In FIG. 4, the system 400 includes a color space converter 410, a brightness adaptive controller 420 and a soft clipper 430.

As shown in FIG. 4, the color space converter 410 receives a first color space format signal and converts the first color space format signal into a second color space format signal. The first color space format signal can be a brightness and chromatic signal (YCbCr, YUV), and the second color space format signal can be an RGB signal, i.e., red (R), green (G) and blue (B) signals.

When the first color space format signal is the YCbCr signal, the color space converter 410 converts the first color space format signal (YCbCr) into the second color space format signal (RGB) based on the equation as follows:

$$\begin{bmatrix} R \\ G \\ B \end{bmatrix} = \begin{bmatrix} 1 & 0 & 1.5748 \\ 1 & -0.1873 & -0.4681 \\ 1 & 1.8556 & 0 \end{bmatrix} \begin{bmatrix} Y \\ Cb \\ Cr \end{bmatrix}.$$

The brightness adaptive controller 420 is connected to the color space converter 410 in order to produce a gain $gain_Y$ and an offset $offset_Y$ based on a brightness value Y. The brightness value Y is derived from the second color space format signal.

The brightness adaptive controller 420 computes the brightness value based on the equation as follows:

$$Y=0.2126\times R+0.7152\times G+0.0722\times B,$$

where Y indicates the brightness value, and R, G, B respectively indicate red, green, blue signals of the second color space format signal. In other embodiments, the brightness Y can be the brightness signal of the first color space format signal.

The brightness adaptive controller 420 computes the gain based on the equation as follows:

$$gain_Y = \frac{K-Y}{\text{rgb\_max}-Y},$$

where rgb_max indicates a maximum of the second color space format signal, $gain_Y$ indicates the gain, Y indicates the brightness, and K is a constant. When the corrected second color space format signal is represented by n bits, the constant is obtained as $K=2^n-1$.

The brightness adaptive controller 420 computes the offset based on the equation as follows:

$$offset_Y = K - \frac{K-Y}{\text{rgb\_max}-Y}\times \text{rgb\_max},$$

where $offset_Y$ indicates the offset.

Since the brightness adaptive controller 420 computes the gain $gain_Y$ and the offset $offset_Y$ based on the brightness value Y for the soft clipper 430, the soft clipper 430 in the invention can overcome the problems in the typical soft clip operation that the maximum of a gray level cannot be displayed and the produced brightness is reduced.

The soft clipper 430 is connected to the color space converter 410 and the brightness adaptive controller 420 in order to clip the second color space format signal (RGB) based on the gain $gain_Y$ and the offset $offset_Y$ to thereby produce the corrected second color space format signal $RGB_{out}$.

The soft clipper 430 computes the corrected second color space format signal $RGB_{out}$ based on the equation as follows:

$$RGB_{out}=\min(RGB, RGB\times gain_Y+offset_Y),$$

where $RGB_{out}$ indicates the corrected second color space format signal, $gain_Y$ indicates the gain, $offset_Y$ indicates the offset, and RGB indicates the second color space format signal. That is, the soft clipper 430 multiplies the second color space format signal RGB with the gain $gain_Y$ to have a multiplication value $RGB\times gain_Y$, then adds this multiplication value $RGB\times gain_Y$ to the offset $offset_Y$ to generate a modified second color space format signal $RGB\times gain_Y+offset_Y$, and selects the minimum one of the second color space format signal RGB and the modified second color space format signal $RGB\times gain_Y+offset_Y$ as the corrected second color space format signal $RGB_{out}$.

Figure 5:
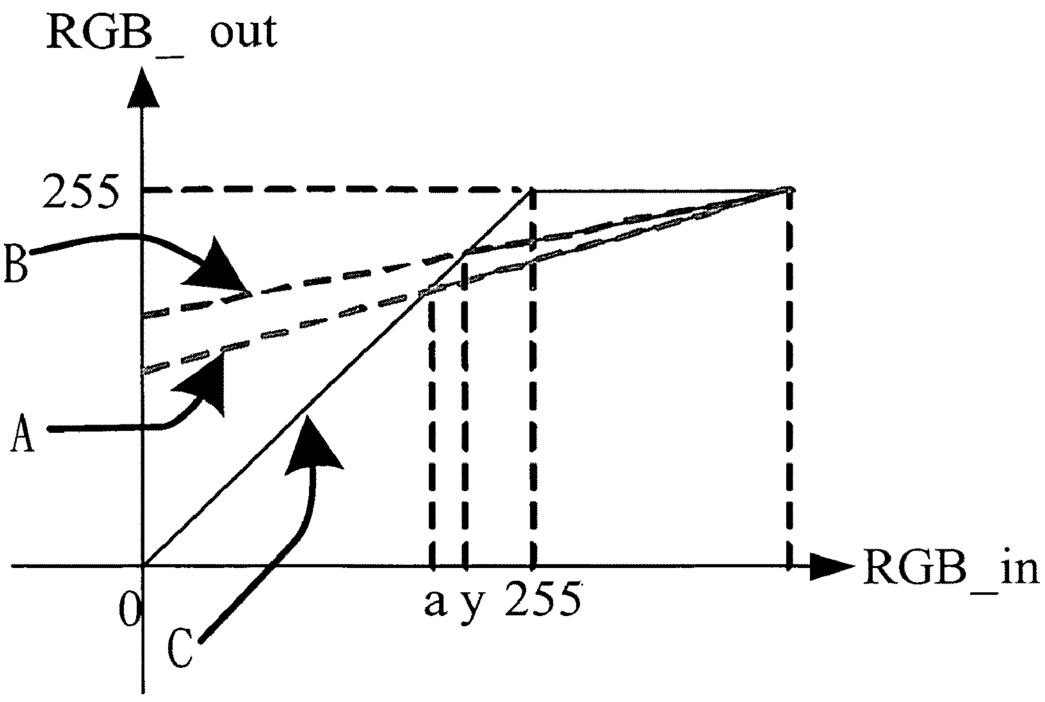
FIG. 5 is a schematic graph of changing a soft clip operation based on brightness information according to the invention.
Figure 6:
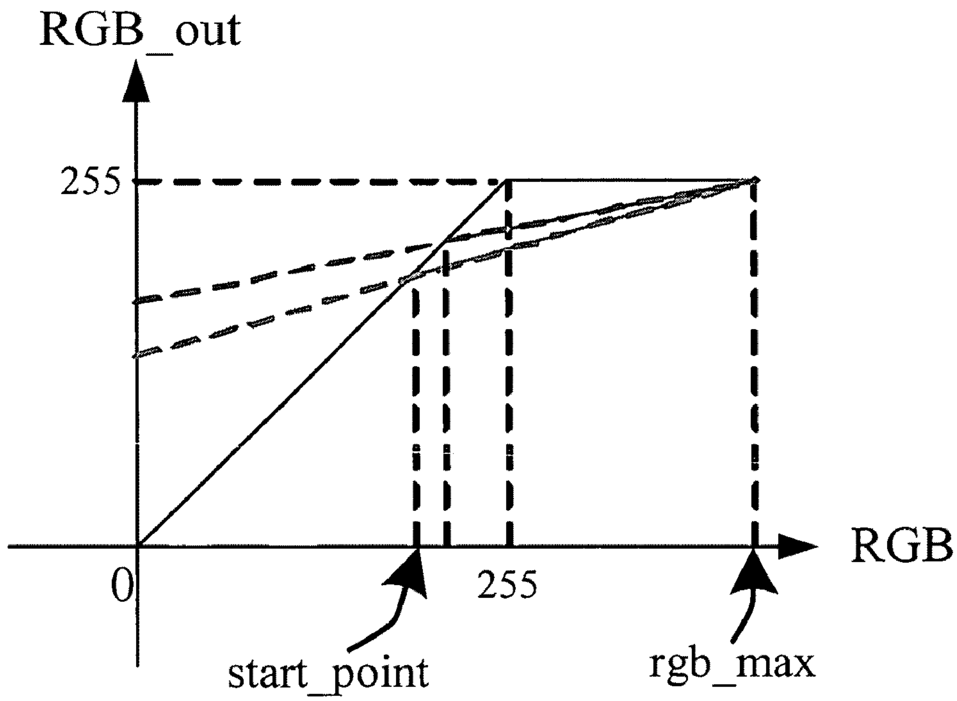
FIG. 6 is a schematic graph of a soft clip operation according to the invention.

The brightness adaptive controller 420 can determine the gamut size of soft clip operation based on the brightness value Y. FIG. 5 is a schematic graph of changing a soft clip operation based on brightness information according to the invention. When the brightness value is greater than the start point 'a' initially set for the soft clip operation, it changes the relationship between the input and the output. As shown in FIG. 5, when the brightness value 'y' and the R, G, B values are smaller than 'a', the relationship responds to the 'C' line. When the brightness value 'y' is smaller than 'a' and the R, G, B values is greater than 'a', the relationship responds to the 'A' line. When the brightness value 'y' is greater than 'a' and the R, G, B values are smaller than the brightness value 'y', the relationship responds to the 'C' line. When the brightness value 'y' is greater than 'a' and the R, G, B values are greater than the brightness value 'y', the relationship responds to the 'B' line. Namely, the start point 'a' is varied with the brightness value. When the brightness value 'y' is smaller than 'a', the start point is 'a', and conversely the start point equals to the brightness value 'y'. Accordingly, the brightness adaptive controller 420 can output different gain $gain_Y$ and offset $offset_Y$ based on the brightness information. In addition, the corrected second color space format signal $RGB_{out}$ is the smaller one between RGB and $RGB\times gain_Y+offset_Y$. Since the brightness value 'y' is increased with the start point increase, the gamut of the soft clip operation is zero when the brightness value 'y' reaches to the maximum. Thus, the invention can reserve the brightness of a gray image without being reduced by the soft chip operation.

The invention focuses on the condition that the RGB values of the second color space format signal have an overflow. FIG.

6 is a schematic graph of a soft clip operation according to the invention. As an example of the corrected second color space format signal $RGB_{out}$ in an 8-bit representation, the corrected second color space format signal $RGB_{out}$ ranges from zero to 255. The second color space format signal greater than eight bits while the corrected second color space format signal $RGB_{out}$ is represented in eight bits. Preferably, the second color space format signal RGB is represented in nine bits. The start point in the soft clip operation is set to a value start_point ranging from zero to 255. The second color space format signal RGB has an adjustable maximum rgb_max, which is a parameter determined by the information of the xvYCC specification or by calculating the image color contents in a time interval.

When the brightness value Y is greater than start_point, the soft clip operation starts to produce different gain $gain_Y$ and offset $offset_Y$ based on the brightness value Y. When the brightness value Y is smaller than or equal to start_point, the gain $gain_Y$ and the offset $offset_Y$ are computed as follows:

$$gain_{start\_point} = \frac{255 - \text{start\_point}}{\text{rgb\_max} - \text{start\_point}}$$

$$offset_{start\_point} = 255 - \frac{255 - \text{start\_point}}{\text{rgb\_max} - \text{start\_point}} \times \text{rgb\_max},$$

where start_point indicates a value of the start point, and rgb_max indicates an adjustable parameter. For example, rgb_ max=350. When the brightness value Y is greater than start_point, the gain $gain_Y$ and the offset $offset_Y$ are computed as follows:

$$gain_Y = \frac{255 - Y}{\text{rgb\_max} - Y}$$

$$offset_Y = 255 - \frac{255 - Y}{\text{rgb\_max} - Y} \times \text{rgb\_max}$$

$$Y = \text{start\_point} + 1 \sim 255.$$

In practical design of the brightness adaptive controller 420 and the soft clipper 430, start_point=200 and rgb_max=350 are first set. The second color space format signal RGB is a BT.709 RGB signal. In this case, the brightness value Y is computed as follows.

$$Y = 0.2126 \times R + 0.7152 \times G + 0.0722 \times B.$$

However, other manner that can be representative of the brightness information is also applicable, not limited to the above computation. For example, Y=(R+G+B)/3, or the brightness of the first color space format signal can be used as the brightness value Y in computation.

Figure 7:
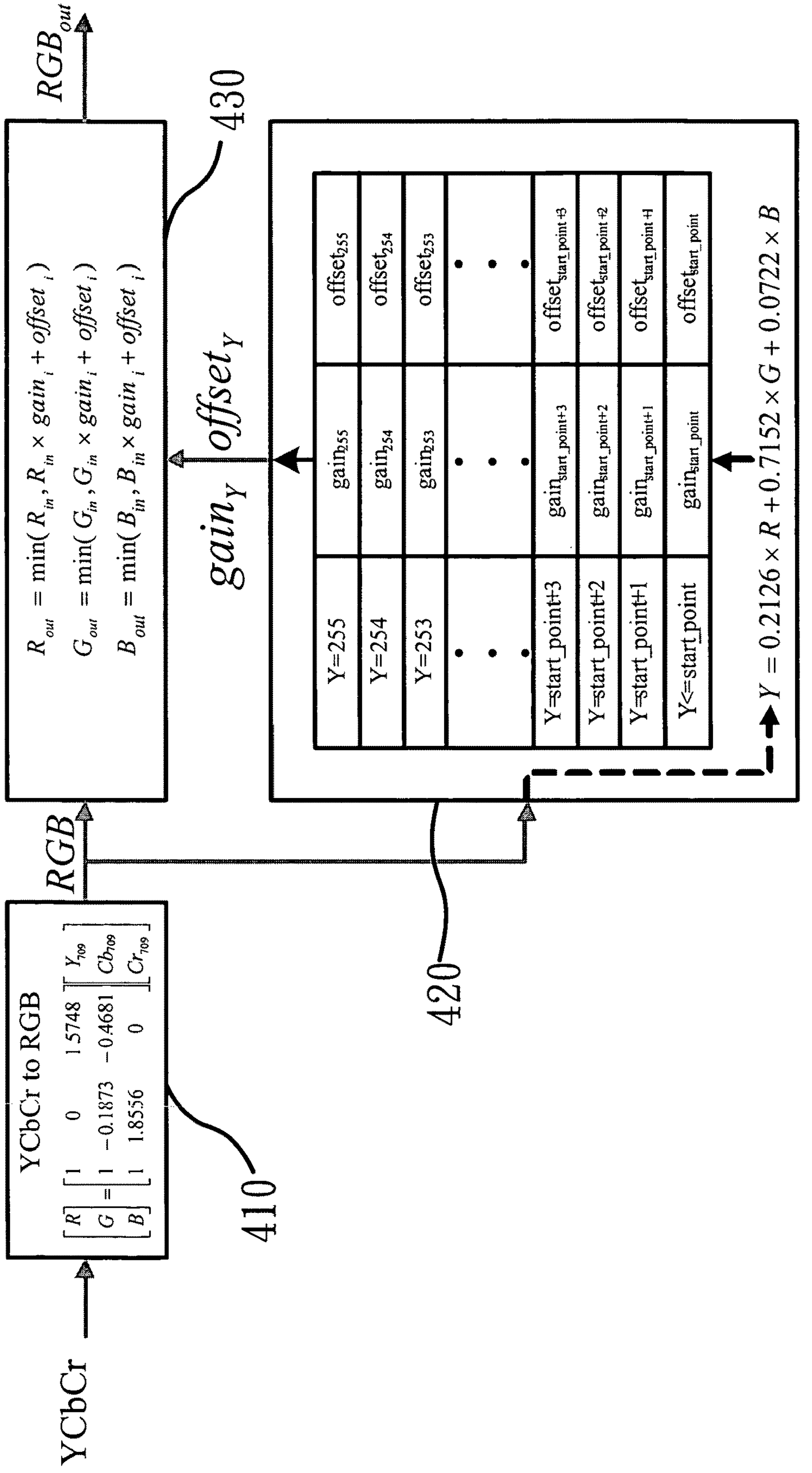
FIG. 7 is a schematic diagram of a system for adaptive color space conversion using a look-up table to produce gains and offsets according to the invention.

The brightness adaptive controller 420 can use the above equations or a lookup table to produce the gain $gain_Y$ and the offset $offset_Y$. FIG. 7 is a schematic diagram of the system 400 for adaptive color space conversion that uses a look-up table to produce the gains and the offsets according to the invention.

As cited, the soft clip operation of the prior art does not consider the brightness information so that it cannot display the maximum of a gray level for a gray image and accordingly the brightness is reduced. By contrast, the invention changes the soft clip operation based on the brightness information. The essential purpose above is to adjust the gains $gain_Y$ and the offsets $offset_Y$ of the soft clipper 430 based on the different brightness values when the values exceed the targeted gamut on improving color conversion. Thus, the detail features are restored without having any loss on the gray image, and the image details are reserved. In addition, when an xvYCC image content is output by a display not supporting the xvYCC color space, the image details are still reserved.

Although the present invention has been explained in relation to its preferred embodiment, it is to be understood that many other possible modifications and variations can be made without departing from the spirit and scope of the invention as hereinafter claimed.

What is claimed is:

1. A system for adaptive color space conversion, comprising:

a color space converter, for receiving a first color space format signal and converting the first color space format signal into a second color space format signal;

a brightness adaptive controller, connected to the color space converter, for producing a gain and an offset based on a brightness value; and a soft clipper, connected to the color space converter and the brightness adaptive controller, for clipping the second color space format signal based on the gain and the offset to produce a corrected second color space format signal;

wherein the soft clipper multiplies the second color space format signal with the gain to have a multiplication value, which is then added to the offset to generate a modified second color space format signal, and selects a minimum one of the second color space format signal and the modified second color space format signal as the corrected second color space format signal.

2. The system as claimed in claim 1, wherein the first color space format signal is YCbCr signal and the second color space format signal is an RGB signal.

3. The system as claimed in claim 2, wherein the brightness adaptive controller computes the gain based on the following equation when the brightness value is smaller than or equal to a start point:

$$gain_Y = \frac{K - \text{start\_point}}{\text{rgb\_max} - \text{start\_point}};$$

and on the following equation when the brightness value is greater than the start point:

$$gain_Y = \frac{K - Y}{\text{rgb\_max} - Y},$$

where start point indicates a value of the start point, rgb-_max indicates a maximum of the second color space format signal, $gain_Y$ indicates the gain, Y indicates the brightness value, and $K=2^n-1$ when the corrected second color space format signal is represented in n bits.

4. The system as claimed in claim 3, wherein the brightness adaptive controller computes the offset based on the following equation when the brightness value is smaller than or equal to the start point:

$$offset_Y = K - \frac{K - \text{start\_point}}{\text{rgb\_max} - \text{start\_point}} \times \text{rgb\_max};$$

and on the following equation when the brightness value is greater than the start point:

$$offset_Y = K - \frac{K - Y}{\text{rgb\_max} - Y} \times \text{rgb\_max},$$

where $\text{offset}_Y$ indicates the offset.

5. The system as claimed in claim 2, wherein when the brightness value and a value of the second color space format signal are smaller than the value of the start point, a relationship between the corrected second color space format signal and the second color space format signal corresponds to a line with a third slope, when the brightness value is smaller than the value of the start point and the value of the second color space format signal is greater than the value of the start point, the relationship of the corrected second color space format signal and the second color space format signal responds to a line with a first slope, when the brightness value is greater than the value of the start point and the value of the second color space format signal are smaller than the brightness value, the relationship of the corrected second color space format signal and the second color space format signal responds to the line with the third slope, and when the brightness value is greater than the value of the start point and the value of the second color space format signal are greater than the brightness value, the relationship of the corrected second color space format signal and the second color space format signal responds to a line with a second slope.

6. The system as claimed in claim 4, wherein the soft clipper computes the corrected second color space format signal based on an equation as follows:

$$\text{RGB}_{out} = \min(\text{RGB}, \text{RGB} \times \text{gain}_Y + \text{offset}_Y),$$

where $\text{RGB}_{out}$ indicates the corrected second color space format signal, and RGB indicates the second color space format signal.

7. The system as claimed in claim 4, wherein the gain and the offset are obtained by a lookup table.

8. The system as claimed in claim 1, wherein the first color space format signal is a brightness and chromatic signal.

9. The system as claimed in claim 8, wherein the color space converter converts the first color space format signal into the second color space format signal based on a matrix as follows:

$$\begin{bmatrix} 1 & 0 & 1.5748 \\ 1 & -0.1873 & -0.4681 \\ 1 & 1.8556 & 0 \end{bmatrix}.$$

10. The system as claimed in claim 2, wherein the brightness adaptive controller produces the brightness value based on en equation as follows:

$$Y = 0.2126 \times R + 0.7152 \times G + 0.0722 \times B,$$

where Y indicates the brightness value, R indicates a red signal, G indicates a green signal, and B indicates a blue signal.

11. A method for adaptive color space conversion in a color image device of high definition TV, comprising:

a color space conversion step, for receiving a first color space format signal and converting the first color space format signal into a second color space format signal;

a brightness adaptive control step, for producing a gain and an offset based on a brightness value; and a soft clip step, for clipping the second color space format signal based on the gain and the offset to produce a corrected second color space format signal;

wherein the soft clip step multiplies the second color space format signal with the gain to have a multiplication value, which is then added to the offset to generate a modified second color space format signal, and selects a minimum one of the second color space format signal and the modified second color space format signal as the corrected second color space format signal, and wherein said color space conversion, brightness adaptive control, and soft clip steps are implemented in said high definition TV.

12. The method as claimed in claim 10, wherein the first color space format signal is YCbCr signal and the second color space format signal is an RGB signal.

13. The method as claimed in claim 12, wherein the brightness adaptive control step computes the gain based on the following equation when the brightness value is smaller than or equal to a start point:

$$gain_Y = \frac{K - \text{start\_point}}{\text{rgb\_max} - \text{start\_point}};$$

and on the following equation when the brightness value is greater than the start point:

$$gain_Y = \frac{K - Y}{\text{rgb\_max} - Y},$$

where start point indicates a value of the start point, rgb_max indicates a maximum of the second color space format signal, $\text{gain}_Y$ indicates the gain, Y indicates the brightness value, and $K = 2^n - 1$ when the corrected second color space format signal is represented in n bits.

14. The method as claimed in claim 13, wherein the brightness adaptive controller computes the offset based on the following equation when the brightness value is smaller than or equal to the start point:

$$offset_Y = K - \frac{K - \text{start\_point}}{\text{rgb\_max} - \text{start\_point}} \times \text{rgb\_max};$$

and on the following equation when the brightness value is greater than the start point:

$$offset_Y = K - \frac{K - Y}{\text{rgb\_max} - Y} \times \text{rgb\_max},$$

where $\text{offset}_Y$ indicates the offset.

15. The method as claimed in claim 12, wherein when the brightness value and a value of the second color space format signal are smaller than the value of the start point, a relationship between the corrected second color space format signal and the second color space format signal corresponds to a line with a third slope, when the brightness value is smaller than the value of the start point and the value of the second color space format signal is greater than the value of the start point, the relationship of the corrected second color space format signal and the second color space format signal responds to a line with a first slope, when the brightness value is greater than the value of the start point and the value of the second color space format signal are smaller than the brightness value, the relationship of the corrected second color space format signal and the second color space format signal responds to the line with the third slope, and when the brightness value is greater than the value of the start point and the value of the second color space format signal are greater than the brightness value, the relationship of the corrected second color space format signal and the second color space format signal responds to a line with a second slope.

16. The method as claimed in claim 14, wherein the soft step computes the corrected second color space format signal based on an equation as follows:

$$RGB_{out}=\min(RGB, RGB\times gain_Y+offset_Y),$$

where $RGB_{out}$ indicates the corrected second color space format signal, and RGB indicates the second color space format signal.

17. The method as claimed in claim 14, wherein the gain and the offset are obtained by a lookup table.

18. The method as claimed in claim 11, wherein the first color space format signal is a brightness and chromatic signal.

19. The method as claimed in claim 16, wherein the color space converter converts the first color space format signal into the second color space format signal based on a matrix as follows:

$$\begin{bmatrix} 1 & 0 & 1.5748 \\ 1 & -0.1873 & -0.4681 \\ 1 & 1.8556 & 0 \end{bmatrix}.$$

20. The method as claimed in claim 12, wherein the brightness adaptive controller produces the brightness value based on an equation as follows:

$$Y=0.2126\times R+0.7152\times G+0.0722\times B,$$

where Y indicates the brightness value, R indicates a red signal, G indicates a green signal, and B indicates a blue signal.

* * * * *